United States Patent
Tan et al.

(10) Patent No.: US 10,560,094 B2
(45) Date of Patent: Feb. 11, 2020

(54) ISOLATION MODULE FOR USE BETWEEN POWER RAILS IN AN INTEGRATED CIRCUIT

(71) Applicant: Intel Corporation, Santa Clara, CA (US)

(72) Inventors: Fern Nee Tan, Bayan Lepas (MY); Sanjiv Soman, Seattle, WA (US); Alexander Levin, Tacoma, WA (US); Srinivasan Rajagopalan, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 358 days.

(21) Appl. No.: 15/670,740

(22) Filed: Aug. 7, 2017

(65) Prior Publication Data

US 2017/0338820 A1  Nov. 23, 2017

Related U.S. Application Data (62) Division of application No. 14/046,592, filed on Oct. 4, 2013, now Pat. No. 9,729,151.

(51) Int. Cl.
*H03K 3/012* (2006.01)
*H03K 19/003* (2006.01)
(Continued)

(52) U.S. Cl.
CPC ..... *H03K 19/00346* (2013.01); *H01L 23/645* (2013.01); *H01L 24/13* (2013.01);
(Continued)

(58) Field of Classification Search
CPC . H03K 19/00346; H01L 23/645; H01L 24/13; H01L 2924/14; H01L 2224/16227;
(Continued)

(56) References Cited

U.S. PATENT DOCUMENTS 6,657,275 B1 * 12/2003 Chung ................ H01L 23/5222
257/306
6,664,606 B2 * 12/2003 Estes .................... H03H 7/0115
257/531

(Continued)

OTHER PUBLICATIONS

"U.S. Appl. No. 14/046,592, Non Final Office Action dated Oct. 3, 2016 ", 13 pgs.

(Continued)

*Primary Examiner* — Jared Fureman
*Assistant Examiner* — Michael J Warmflash
(74) *Attorney, Agent, or Firm* — Schwegman Lundberg & Woessner, P.A.

(57) ABSTRACT

An integrated circuit (IC) can include multiple power domains that are served by a common power source. In an example, a first IC power rail can be coupled to the source and a first consumer circuit. A second IC power rail can be coupled to a second consumer circuit. The second IC power rail can receive a filtered power signal from an isolation module that is coupled between the first and second power rails. In an example, an isolation module includes an integrated inductor and a capacitor (e.g., a land-side capacitor). The integrated inductor can optionally include multiple spaced apart conductive layers that are electrically coupled. The integrated inductor can optionally include a series of conductive traces and plated through holes or vias that together provide a current path with multiple turns.

20 Claims, 7 Drawing Sheets

(51) Int. Cl.
*H01L 23/64* (2006.01)
*H01L 23/00* (2006.01)

(52) U.S. Cl.
CPC ...... *H01L 24/16* (2013.01); *H01L 2223/6688* (2013.01); *H01L 2224/131* (2013.01); *H01L 2224/16227* (2013.01); *H01L 2924/14* (2013.01); *H01L 2924/15311* (2013.01); *H01L 2924/19041* (2013.01); *H01L 2924/19105* (2013.01); *Y10T 307/406* (2015.04)

(58) Field of Classification Search
CPC . H01L 2924/19041; H01L 2924/15311; H01L 2224/131; H01L 24/16; H01L 2223/6688; H01L 2924/19105; Y10T 307/406
See application file for complete search history.

(56) References Cited

U.S. PATENT DOCUMENTS

| | | | |
|---|---|---|---|
| 7,151,298 | B1 | 12/2006 | Eggert et al. |
| 7,518,248 | B2 * | 4/2009 | Li ...................... H01F 17/0033 |
| | | | 257/531 |
| 7,839,129 | B2 * | 11/2010 | Pant ................. H03K 19/00361 |
| | | | 323/271 |
| 9,729,151 | B2 | 8/2017 | Tan et al. |
| 2003/0197244 | A1 | 10/2003 | Estes |
| 2004/0000974 | A1 | 1/2004 | Odenaal et al. |
| 2004/0053584 | A1 | 3/2004 | Mickle et al. |
| 2004/0085175 | A1 | 5/2004 | Lowther |
| 2015/0097431 | A1 | 4/2015 | Tan et al. |

OTHER PUBLICATIONS

"U.S. Appl. No. 14/046,592, Notice of Allowance dated Mar. 31, 2017", 8 pgs.
"U.S. Appl. No. 14/046,592, Response filed Feb. 3, 2017 to Non Final Office Action dated Oct. 3, 2016", 14 pgs.
"U.S. Appl. No. 14/046,592, Response filed Aug. 17, 2016 to Restriction Requirement dated Jun. 17, 2016", 7 pgs.
"U.S. Appl. No. 14/046,592, Restriction Requirement dated Jun. 17, 2016", 5 pgs.

* cited by examiner

ISOLATION MODULE FOR USE BETWEEN POWER RAILS IN AN INTEGRATED CIRCUIT

PRIORITY APPLICATION

This application is a divisional of U.S. application Ser. No. 14/046,592, filed Oct. 4, 2013, which is incorporated herein by reference in its entirety.

TECHNICAL FIELD

Embodiments described herein generally relate to integrated circuits. More specifically, the embodiments relate to power signal management in integrated circuits.

BACKGROUND

Processor circuits can include a large number of integrated transistors and other components interconnected on a common die (chip). A processor circuit can be mounted on a substrate to form a package, and the package can subsequently be mounted on a printed circuit board for installation in a larger electronic system. Modern processor circuits regularly integrate multiple different functions, such as graphics, display engines, security engines and others on a single chip. Processor circuit-based products can be complicated in design, and the same or similar processor circuits can be configured to service a variety of market segments, such as server, desktop, mobile, or embedded system markets. Some markets seek to use single chip system-on-chip (SoC) solutions that combine at least some of a processor core, platform controller hub (PCH), memory controller hub (MCH), input/output controller (ICH) and other segment-specific acceleration elements onto a single chip.

Package size requirements for processor circuits are continually driven down to accommodate ultra small, thin, and light form factors, such as can be required for mobile or other devices. However, functionality requirements for smaller packages increase in every generation with feature additions, such as integrated clocks, digital signal processors, and multiple input/output interfaces, among others. In an example, distinct features or functions can correspond to different power domains in an integrated circuit, such as having different noise sensitivities and power signal requirements.

Inductors are used in integrated circuit applications including filters, power supplies, and voltage regulators. An inductor generally comprises a conductor that is configured to store energy in a magnetic field adjacent to the conductor when a current passes through the conductor. A conductor comprising a portion of the inductor typically includes one or more turns that can concentrate a magnetic field, induced by a current flowing through the conductor, in an area near the conductor. In some examples, integrated inductors include spiral traces in conductive layers, such as in conductive semiconductor, package, or printed circuit board substrate layers, to form inductor turns.

BRIEF DESCRIPTION OF THE DRAWINGS

In the drawings, which are not necessarily drawn to scale, like numerals may describe similar components in different views. The drawings illustrate generally, by way of example, but not by way of limitation, various embodiments discussed in the present document.

DETAILED DESCRIPTION

Power signal management can be critical to function in integrated circuits with multiple functional domains. The multiple functional domains can have similar or dissimilar power requirements and tolerances to signal noise. As a number of functional domains, or individual consumer circuits, increases in an integrated circuit, a form factor requirement can change as well. For example, the form factor requirement may be smaller, thinner, or lighter weight than a previous generation. Accordingly, unique solutions for signal processing and power signal management can be applied to accommodate the new circuit specifications.

Previously, power consumption increased with each subsequent generation, with package size growing commensurate with the addition of each feature. With an increase in mobile and small devices, however, package size is driven ever smaller, and aggressive power scaling can be required to meet the design size objective. In an example, small package sizes can be achieved by reducing or eliminating redundant pins, and optimizing or merging integrated power lines, or power rails, by way of a filter or isolation module.

An isolation module can include an integrated inductor, and the isolation module can be coupled between power rails. An integrated inductor can include, among other designs, a coil inductor comprising multiple, parallel traces (e.g., stacked, or overlapping), and a core (e.g., an air core). An integrated inductor can alternatively or additionally include a series of plated-through-holes (PTHs) or conductive vias that, together with multiple conductive planar traces, provide a current path that can undergo multiple turns to provide an inductance. In an example, an integrated inductor can be coupled between a power supply pin or power supply rail and one or more other power rails comprising a consumer circuit. The integrated inductor can be customized for different inductance and resistance characteristics to provide precisely tuned filtering or isolation.

In an example, an integrated circuit comprises at least one semiconductor die that can be electrically coupled (e.g., through solder bumps) to a package substrate. The semiconductor die can comprise at least one of an isolation module or a consumer circuit. The die can be electrically coupled to the substrate throughout the majority of its undersurface (e.g., using a flip-chip ball grid array type package) to allow for increased external connections and current capacity. Generally, the term "substrate" refers to any substrate that a die is mounted to or on, including a dedicated or shared package substrate, interposer substrate, or printed circuit board. That is, in some embodiments, the die can be mounted on a printed circuit board or on an interposer substrate.

Target integrated inductor characteristics can be selected, for example, based on a desired 3 dB roll-off frequency, below which power signal noise is to be attenuated. An integrated inductor design can begin with a resistive target that includes considerations for total current draw expected through the inductor. Inductive and capacitive targets can follow the resistive target, such as to achieve the desired roll-off location and filter magnitude. The resistive target can be evaluated first to ensure a design can support some minimum resistance associated with the conductors required to transmit a signal to and from an integrated inductor location. In an example, capacitive elements can be omitted from some isolation modules, such as where stray board or die-level capacitances are sufficient to meet a design objective. In some examples, capacitive elements can include land-side capacitors (LSC) that are electrically coupled between a power rail and a reference node (see, e.g., FIG. 1).

Among other considerations, physical space and functional requirements for an integrated circuit can influence selection of one of an integrated coil inductor or an integrated PTH inductor for use in an isolation module. In an example an integrated coil inductor can be selected when an aggressor circuit (i.e., a noise source) and a victim circuit (i.e., a circuit susceptible to noise) are physically adjacent or proximal to one another, or a large degree of isolation is required, if physical space permits. In an example an integrated PTH inductor can be selected when aggressor and victim circuits are more distant from one another, less isolation is required, or less physical space is available.

In an example comprising an integrated circuit, a limited number of external electrical interconnects (e.g., pins, bumps, etc.) can be provided. A supply voltage can be received using a subset of the interconnects (e.g., one or two pins). In an example, the integrated circuit includes ten different consumer circuits that can each require a portion of the supply voltage signal. Each of the different consumer circuits is a potential aggressor or victim circuit relative to the others. That is, the inherent or self-noise of each of the consumer circuits can, in some examples, impact one or more of the other consumer circuits. For example, a switching frequency of a first consumer circuit can impact or adversely condition the power supply signal such that a second consumer circuit (e.g., a non-switching circuit, or a switching circuit operable at a different frequency) is caused to generate errors or is nonfunctional when it uses the same power supply signal. In an example where an additional power pin cannot simply be added (e.g., due to physical space constraints), an integrated isolation module can be provided between the consumer circuits. The integrated isolation module can include an integrated coil or PTH inductor.

Figure 1:
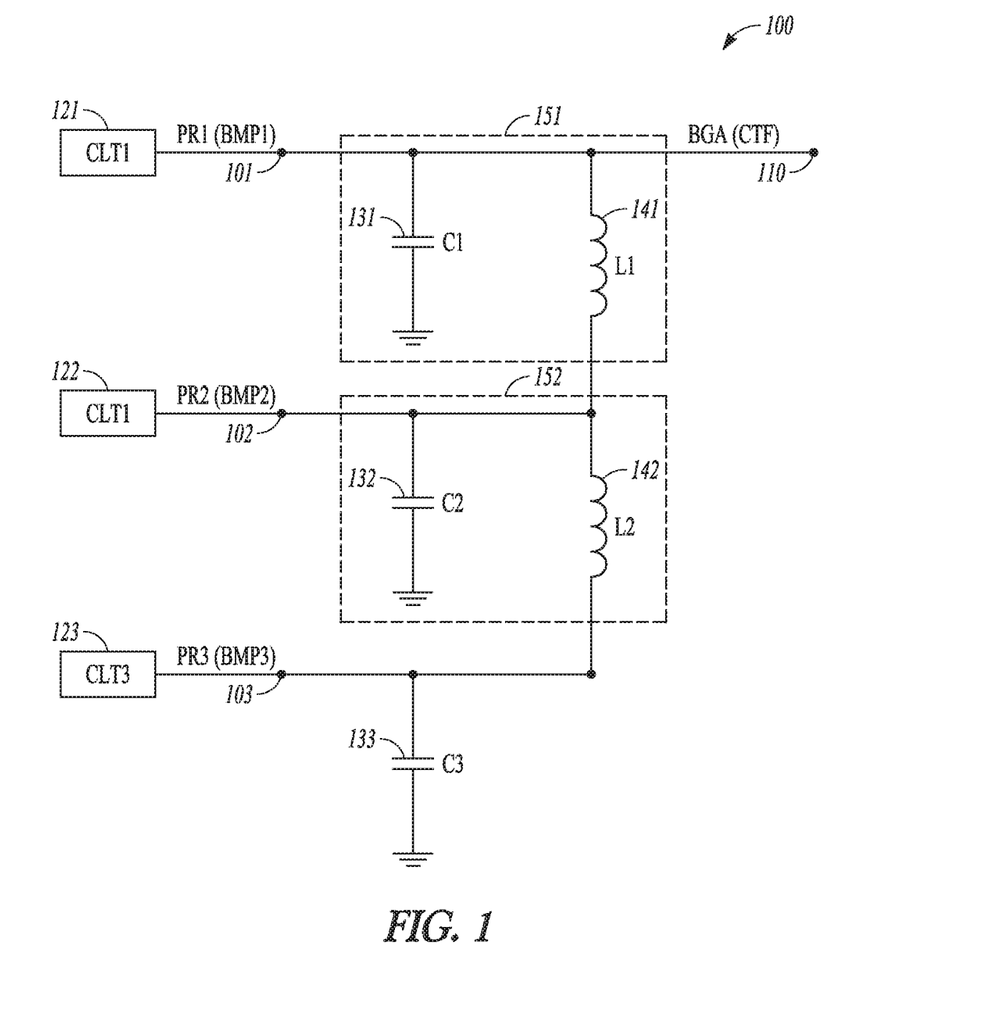
FIG. 1 illustrates generally a schematic representative of a portion of an integrated circuit comprising multiple power domains.

Referring now to FIG. 1, an example 100 includes a schematic representative of a portion of an integrated circuit. A power signal can be supplied through a ball grid array (BGA) or Vcc pin 110 to the circuit. The power signal can be distributed to multiple different consumer circuits, such as using one or more isolation modules. In an example, the power signal routing and the placement of the one or more isolation modules can be determined by first identifying noise characteristics for each of the consumer circuits (e.g., when decoupled from the others). Consumer circuits that are most susceptible to noise and consumer circuits that produce the most noise can be identified. In an example, the power signal at the BGA 110 can be first supplied to an identified aggressor circuit (e.g., corresponding to a circuit having a relatively high self noise), such as to position the aggressor circuit in a lowest relative inductive loop. Other consumers can be isolated using integrated inductors in one or more isolation modules. In an example, a power rail supplying a victim circuit can be merged with a power rail supplying an aggressor circuit at a package location that is most distant from the noise source near the BGA 110.

In an example, the power signal supplied at the BGA 110 can be transmitted to a first consumer circuit 121 via a first power rail (PR1). PR1 can include a first bump (BMP1) 101. In an example, a first capacitor (C1) 131 can be coupled between the first bump 101 and a reference node. In an example, a first isolation module 151 can be coupled between the first bump 101 and a second bump 102. The second bump 102 can correspond to a second power rail (PR2) that can carry a power signal to a second consumer circuit 122.

The first isolation module 151 can include an inductor, such as a first integrated inductor (L1) 141. The first integrated inductor 141 can include an integrated coil inductor or an integrated PTH inductor. See, for example, the discussion below of coil and PTH inductors in FIGS. 2-5. The first integrated inductor 141 can be coupled to the first and second power rails PR1 and PR2 to provide isolation between the rails. In an example, the first consumer circuit 121 is an aggressor circuit that contributes a relatively high degree of noise to the integrated circuit example 100, and the second consumer circuit 122 is a victim circuit. The second consumer circuit 122 is effectively isolated from the noise originating at the first consumer circuit 121 by way of the first isolation module 151. In an example, a second capacitor (C2) 132 can provide further noise isolation for the second consumer circuit 122.

In an example, a second isolation module 152 can be coupled between the second bump 102 and a third bump 103. The third bump 103 can correspond to a third power rail (PR3) that can carry a power signal to a third consumer circuit 123. The second isolation module 152 can include a second integrated inductor (L2) 142. The second integrated inductor 142 can include an integrated coil inductor or an integrated PTH inductor. The second integrated inductor 142 can be coupled to the second and third power rails PR2 and PR3 to provide isolation between at least these rails. In an example, at least one of the first and second consumer circuits 121 and 122 is an aggressor circuit that contributes a relatively high degree of noise to the integrated circuit example 100, and the third consumer circuit 123 is a victim circuit. The third consumer circuit 123 can be effectively isolated from the noise by way of the second isolation module 152. In an example, a third capacitor (C3) 133 can provide further noise isolation for the third consumer circuit 123. In an example, at least one of the first, second, and third capacitors 131, 132, and 133 can be removed during validation procedures if the IC board or die-level capacitances are found to be sufficient to achieve a noise filtering objective.

In an example, each pair of consumer circuits can be simulated to identify which of the consumer circuits is the aggressor circuit and which is the victim circuit. A coupling noise target can be provided (e.g., 5 mV peak-to-peak), and different inductance, capacitance, and resistance values can be cycled until the design target is reached. In an example, preliminary simulation-based analysis can be helpful to identify large inductance requirements which may not be feasible using integrated inductors. In this case, other aspects of the power distribution system can be redesigned, or the power rails can be differently assigned to achieve a design objective.

Figure 2:
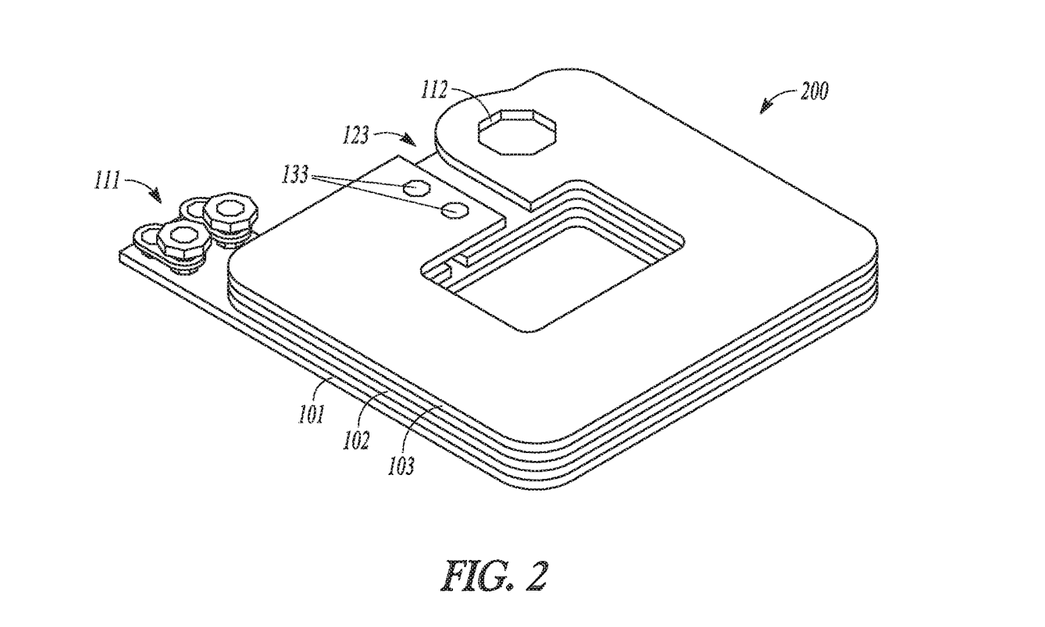
FIG. 2 illustrates generally an example of a perspective view of an integrated coil inductor.

FIG. 2 illustrates generally an example of a perspective view of an integrated coil inductor 200. The coil inductor 200 includes multiple spaced apart, parallel and overlapping conductive layers. In an example, the coil inductor 200 occupies a landing area of about one square millimeter, with a central void area of about 350 square micrometers. In an example, the coil inductor as illustrated in FIG. 2 can provide about 4 nH inductance and about 25 mOhm resistance. The coil inductor 200 can be designed into a package die shadow, such as without causing routing congestion and without adding any materials.

The example coil inductor 200 includes first, second, and third layers 101, 102, and 103 that are approximately similarly sized and shaped. Each of the first, second, and third layers 101, 102, and 103, has approximately the same outer rectangular shape comprising multiple turns and one electrically discontinuous side. The first layer 101 can be electrically coupled to a first coil terminal 111. The third layer 103 can be electrically coupled to a second coil terminal 112. The first and second coil terminals 111 and 112 can be electrically coupled by way of the first, second, and third layers 101, 102, and 103, and multiple conductive vias extending between the layers.

The third layer 103 comprises a pair of conductive vias 133 that electrically couple the third layer 103 to the second layer 102. In the example of FIG. 2, the third layer 103 includes a discontinuity 123 in a first side of the coil, corresponding to a side of the layer comprising the vias 133 and the second coil terminal 112. In other examples, the discontinuity can be in a different side of the layer. In other examples, a single conductive via can be used or multiple additional conductive vias can be used to electrically couple the third layer 103 and the second layer 102.

Figure 3:
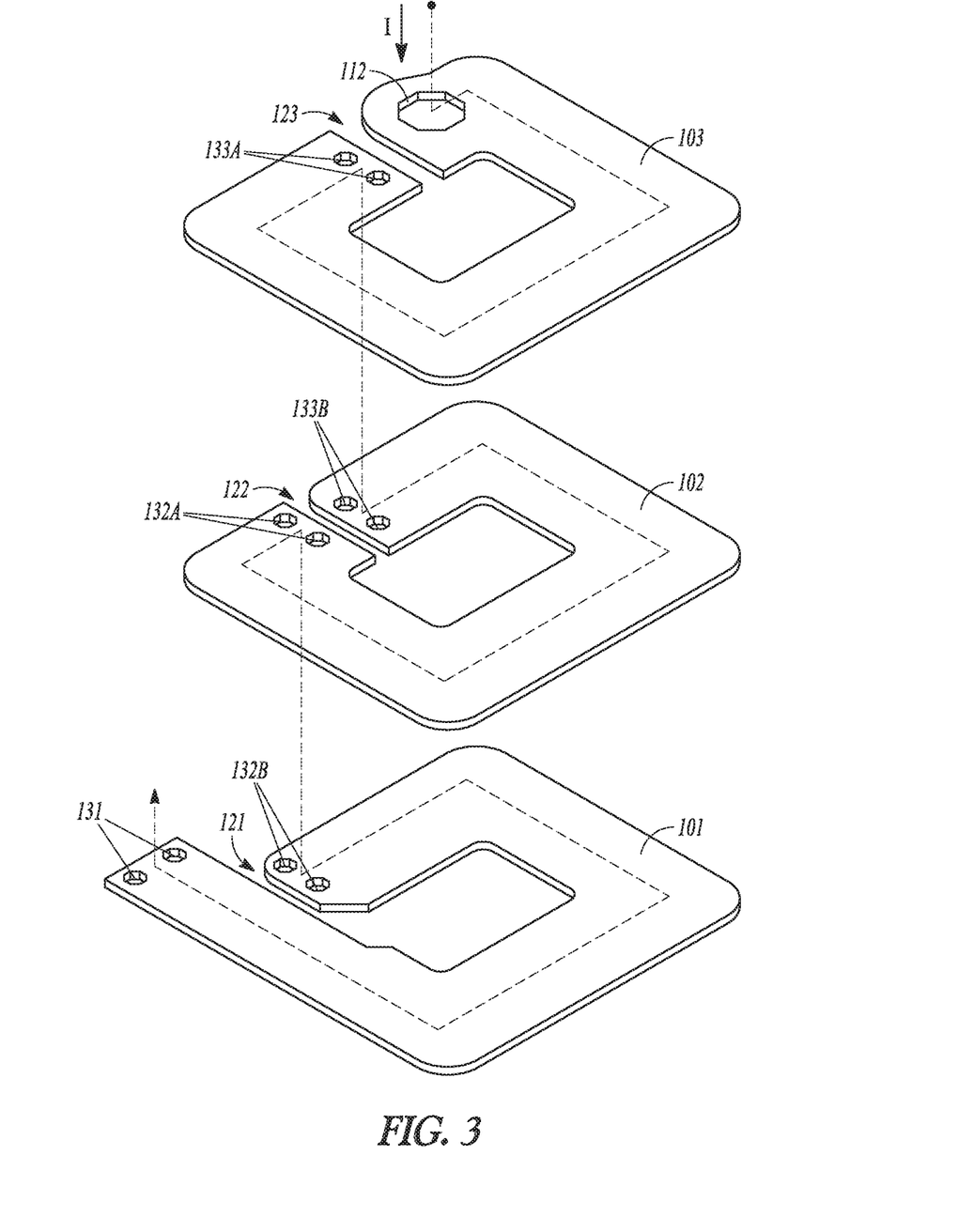
FIG. 3 illustrates generally an example of an exploded view of a portion of an integrated coil inductor.

FIG. 3 illustrates generally an exploded view of the first, second, and third layers 101, 102, and 103, of the integrated coil inductor 200 of FIG. 2. In an example, the thickness of each layer (e.g., in the z-direction) can be uniform, and in other examples, one or more layers can have a thickness that is different than the others. A trace width can be substantially constant about each layer, or a trace width can vary over a single layer, or over adjacent layers. That is, a trace width on a first side of the coil in a particular layer need not match a trace width on the same or different first side of the coil in a different layer.

Multiple variables can be adjusted to influence an inductance or resistance of an integrated inductor. For example, trace width, trace thickness, number of turns, direction of turns, magnitude (degree) of one or more turns, among other variables, can be adjusted to influence an inductance or resistance of an integrated coil inductor. An overall inductor size can be scaled depending on an available area and a congestion factor. In an example, when the inductor is scaled up and made larger, then the inductor resistance characteristic can decrease. In an example, when more turns are provided (e.g., by adding additional layers), the inductance characteristic can increase. Various values for the characteristics that influence resistance and inductance can be modified during a simulation phase to optimize the inductor. Generally, resistance can be optimized first, and inductance can be subsequently optimized.

In the example of FIG. 3, each of the first, second, and third layers 101, 102, and 103, includes a discontinuity on a similar corresponding side of each layer, such that a current path I (corresponding to the dashed line in FIG. 3) flows along a substantially spiral path through the inductor. The second layer 102 includes a discontinuity 122 on the first coil side, similarly to the discontinuity 123 on the first coil side of the third layer 103. The first layer 101 includes a discontinuity 121 on the same first coil side, similarly to the discontinuities 122 and 123 of the second and third layers 102 and 103, respectively.

In an example, the same coil sides that include the discontinuities 121, 122, and 123 comprise one or more through holes that can be used to electrically couple the adjacent layers (e.g., when filled with a conductive material that extends between and couples the layers). The third layer 103 includes the pair of through holes 133A, and the second layer 102 includes the pair of through holes 133B. When the second and third layers 102 and 103 are stacked, the respective pairs of through holes 133B and 133A can substantially vertically line up, or correspond, such that an electrical connection can be established between the second and third layers 102 and 103 using a conductive material disposed in or on the through holes 133B and 133A.

Similarly, the second layer 102 can include a pair of through holes 132A, and the first layer 101 includes a pair of through holes 132B. When the first and second layers 101 and 102 are stacked, the respective pairs of through holes 132B and 132A can substantially vertically line up, or correspond, such that an electrical connection can be established between the first and second layers 101 and 102 using a conductive material disposed in or on the through holes 132B and 132A. Although pairs of through holes are shown in FIG. 2 for each layer, such as to provide redundant electrical connections between the layers, a single through hole, or multiple through holes, can similarly provide a sufficient or improved electrical connection between adjacent layers.

When the first, second, and third layers 101, 102, and 103, are electrically coupled, a current I can flow through the integrated coil inductor 200 along a substantially spiral path that includes multiple turns in a similar direction about the core. In this manner, the multiple layers provide an inductance, such as can be applied to isolate adjacent power rails in an integrated circuit.

Alternatively or additional to an integrated coil inductor, an integrated inductor can include multiple conductors including conductive vias and traces that are arranged to provide a substantially spiral-shaped current path. In an example, a via includes a plated through hole via or a microvia. As used herein, and unless context requires otherwise, the terms via or plated through hole via refer generally to a conductor in a substrate that can be used to electrically couple two or more spaced apart conductive layers in a substrate. Thus, a via is not limited to a through hole via (e.g., a structure having a central void). Although some of the integrated inductor examples provided herein are referred to as using or including plated through hole vias, such integrated inductors can generally be alternatively or additionally manufactured with one or more other conductors (e.g., layers, vias, traces, etc.) that do not include through hole vias.

In an example, plated through hole vias can be used to couple traces separated by relatively large distances, while micro vias can be used to couple extreme outer (upper and lower) trace layers to adjacent layers. In an example, a via can be formed using a hole that is lined or filled with a conducting material (e.g., copper). Generally, vias can be disposed perpendicularly to a plane of a substrate. In some examples, vias can be angled, such as together with a component that permits them to span two or more layers.

Depending on the size of the substrate and number of electrical connections, a substrate can have hundreds or thousands of vias and in many cases, have capacity for even more.

Figure 4:
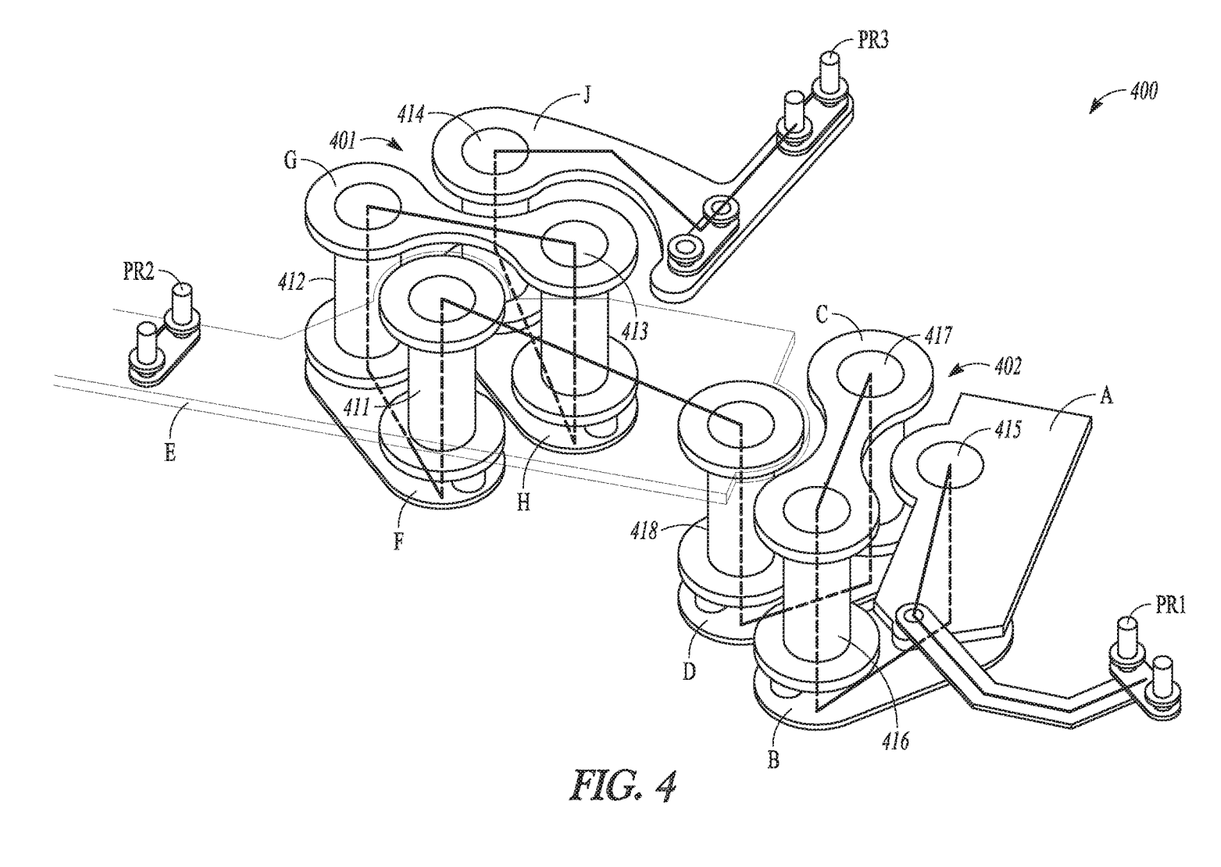
FIG. 4 illustrates generally an example of a perspective view of integrated inductors formed using conductive vias.

FIG. 4 illustrates generally an example 400 of a perspective view of integrated first and second plated through hole via (PTH) inductors 401 and 402. The example 400 includes three power rails PR1, PR2, and PR3. The three power rails PR1, PR2, and PR3 can be electrically coupled by way of respective isolation modules. The isolation modules can include the first and second PTH inductors 401 and 402 to provide noise isolation between the power rails. In an example, the power rails in the example of FIG. 4 correspond generally to the power rails in the example 100 of FIG. 1.

An overall landing area of the PTH inductors 401 and 402 can be less than about one square millimeter, although other PTH inductors can have substantially larger or smaller landing areas. The first and second PTH inductors 401 and 402 each comprise multiple spaced apart, substantially parallel, conductive vias or plated through hole vias that are electrically coupled to multiple different conductive layers. In an example, the first and second PTH inductors 401 and 402 can provide relatively low inductances, such as about 1 nH or less (e.g., relative to an integrated coil inductor, such as described above in the examples of FIGS. 2 and 3). In an example, a PTH inductor can be formed using four plated through hole vias to form a conductive loop, such as can provide about 1 nH inductance. In this example, each PTH and adjacent conductive trace contributes about 250 pH to the inductance of the overall PTH inductor.

Referring again to FIG. 4, the example 400 includes multiple conductive layers A, B, C, D, E, F, G, H, and J. Some of the multiple conductive layers A-J can be coplanar, parallel, or otherwise arranged. For illustrative purposes, each of the multiple conductive layers A-J in the example of FIG. 4 can be considered to be non-coplanar and not directly electrically coupled, unless specified otherwise. In the example 400, the second power rail PR2 is coupled to the third power rail PR3 using the first PTH inductor 401. In this example, the second power rail PR2 corresponds to layer E, and PR3 corresponds to layer J. In an example, layers E and J are coplanar and would be electrically isolated from each other without the first PTH inductor 401.

The first PTH inductor 401 includes multiple electrical paths that traverse an approximately spiral or loop-shaped path. That is, the first PTH inductor 401 includes an electrical path with plated through hole vias and multiple conductive layers that together form a conductive loop. In this example, the first PTH inductor 401 includes four plated through hole vias to provide a conductive loop between layers E and J. That is, the first PTH inductor 401 is electrically coupled between the second and third power rails PR2 and PR3. In the example of FIG. 4, the first PTH inductor 401 includes an electrical path from layer E to layer F by way of a first PTH 411, an electrical path from layer F to layer G by way of a second PTH 412, an electrical path from layer G to layer H by way of a third PTH 413, and an electrical path from layer H to layer J by way of a fourth PTH 414. When an electric current is caused to flow from one of the second and third power rails PR2 and PR3 to the other, the first PTH inductor 401 can provide an inductance that can be used to provide signal noise isolation between the second and third power rails PR2 and PR3.

The second PTH inductor 402 similarly includes multiple electrical paths that traverse an approximately loop-shaped path. The second PTH inductor 402 can include an electrical path with plated through hole vias and multiple conductive layers that together form a conductive loop between layers A and E. That is, the second PTH inductor 402 is electrically coupled between the first and second power rails PR1 and PR2. The second PTH inductor 402 includes an electrical path from layer A to layer B by way of a fifth PTH 415, an electrical path from layer B to layer C by way of a sixth PTH 416, an electrical path from layer C to layer D by way of a seventh PTH 417, and an electrical path from layer D to layer E by way of a eighth PTH 418. When an electric current is caused to flow from one of the first and second power rails PR1 and PR2 to the other, the second PTH inductor 402 can provide an inductance that can be used to provide signal noise isolation between the first and second power rails PR1 and PR2.

Some design variables that contribute to an inductance of an integrated PTH inductor include the lengths, widths, or thicknesses of the conductive layers coupling the vias, the lengths, widths, or thicknesses of the vias, and the proximity of the different layers and vias comprising the integrated inductor. For example, closely positioned vias can provide a tight or narrow conductive loop, which can increase the magnetic flux density in the region about the PTH inductor when current flows through, such as relative to a PTH inductor having vias that are more widely spaced apart. In an example, a layer or trace thickness, as well as a via or PTH thickness, can be adjusted to influence a current density which, in turn, can influence the resulting magnetic flux about a PTH inductor.

An integrated inductor, such as a PTH inductor, can be used for power rail merger for phase locked loop (PLL) circuits. In an example, a portion of a PLL circuit consumes less than about 30 mA, and an integrated PTH inductor can provide about 1 nH inductance. The inductance provided by a PTH inductor can be sufficient to isolate a victim portion of the PLL circuit from an aggressor portion of another PLL circuit, or from an aggressor portion of the same PLL circuit. In some examples, merging power rails for two or more PLL circuits can reduce a number of on-board filter components, such as by reducing a number of LC filters that would otherwise be required for each PLL circuit.

In an example, integrated inductors can be incorporated at a package level, such as for power rail merger. Implementing integrated inductors at the package level can be desirable because design changes can be more easily modified than at the silicon level. In an example, at the package level, an LSC can be easily added to achieve a particular design target. Under some circumstances, an LSC may be unneeded, such as when self noise or coupling noise targets are met without the use of an additional capacitance. For example, the inherent or self capacitance of the die or package can provide a sufficient capacitance that, when coupled with an integrated inductor, can provide sufficient filtering characteristics. By eliminating or excluding an LSC, the package cost can be reduced.

In an example, power rail merger at the package level can be advantageous because the merger can provide a larger decoupling capacitance on the silicon (Cdie) overall, such as can benefit the multiple different power rails. The overall decoupling capacitance can decrease or even eliminate dependency on separate decoupling capacitors for each power rail. Accordingly, an overall cost can be reduced as one or more capacitors are removed from the process.

Figure 5:
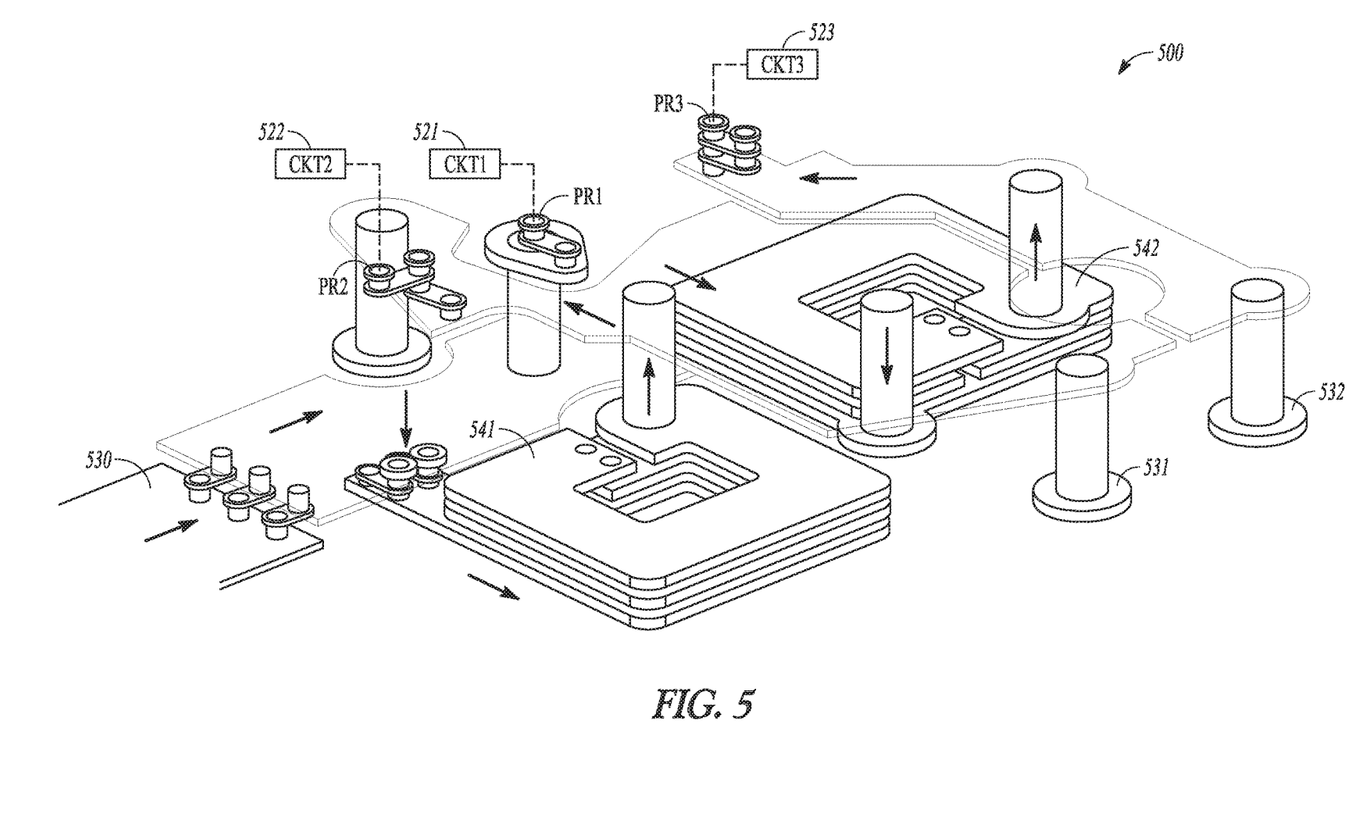
FIG. 5 illustrates generally an example of a layout that includes multiple power rails and integrated inductors.

FIG. 5 illustrates generally an example of a layout 500 that includes multiple power rails and integrated coil inductors. In an example, the layout 500 corresponds to a portion of the example 100 of FIG. 1. The layout 500 shows electrical paths from a BGA terminal 530 to a third power rail PR3 by way of first and second power rails PR1 and PR2, and first and second integrated inductors L1 541 and L2 542. In an example, the power rails have respective terminals that correspond to bumps in the physical circuit. The arrows included in the example of FIG. 5 illustrate generally examples of current flow paths from the BGA terminal 530 to the various power rails. In an example, the layout 500 comprises a physical landing area of less than about 2 mm by 4 mm.

In an example, the layout 500 includes a direct electrical coupling between BGA terminal 530 and the first power rail PR1. That is, the BGA terminal 530 can be electrically coupled to the first power rail PR1 using one or more conductive layers, plated through hole vias, or other conductive means. In an example, a first consumer circuit 521 can be coupled to the first power rail PR1. Second and third consumer circuits 522 and 523 can coupled to respective ones of the second and third power rails PR2 and PR3.

The layout 500 can include an electrical coupling between the first power rail PR1 and the second power rail PR2 that includes a first integrated inductor L1 541. The first integrated inductor L1 541 includes, in the example of FIG. 5, an integrated coil inductor; however, other types of integrated or non-integrated inductors can be alternatively used. In an example, the first integrated inductor L1 541 includes multiple, substantially parallel and overlapping layers (i.e., two or more), such as having a substantially rectangular or circular shape and a central void area. In some examples, the central void area includes a magnetic or other material, and in some examples, other vias (e.g., vias that are not electrically corresponding to the first integrated inductor L1 541) can occupy a portion of the central void area. In the example of FIG. 5, the second power rail PR2 is coupled to a first capacitor terminal 531. The first capacitor terminal 531 can include a terminal of a LSC of a package comprising the layout 500.

In the example of FIG. 5, the layout 500 includes an electrical coupling between the second power rail PR2 and the third power rail PR3 that includes a second integrated inductor L2 542. The second integrated inductor L2 542 can include an integrated coil inductor; however, other types of integrated or non-integrated inductors can be alternatively used. In an example, the second integrated inductor L2 542 includes multiple, substantially parallel and overlapping layers (i.e., two or more), such as having a substantially rectangular or circular shape and a central void area. The second integrated inductor L2 542 can be similarly or differently sized and shaped than the first integrated inductor L1 541, such as to provide the same or different inductance. For example, L1 541 and L2 542 can have different trace widths and different corresponding inductances to provide different levels of power signal isolation. In the example of FIG. 5, the third power rail PR3 is coupled to a second capacitor terminal 532. The second capacitor terminal 532 can include a terminal of an LSC of a package comprising the layout 500.

Figure 6:
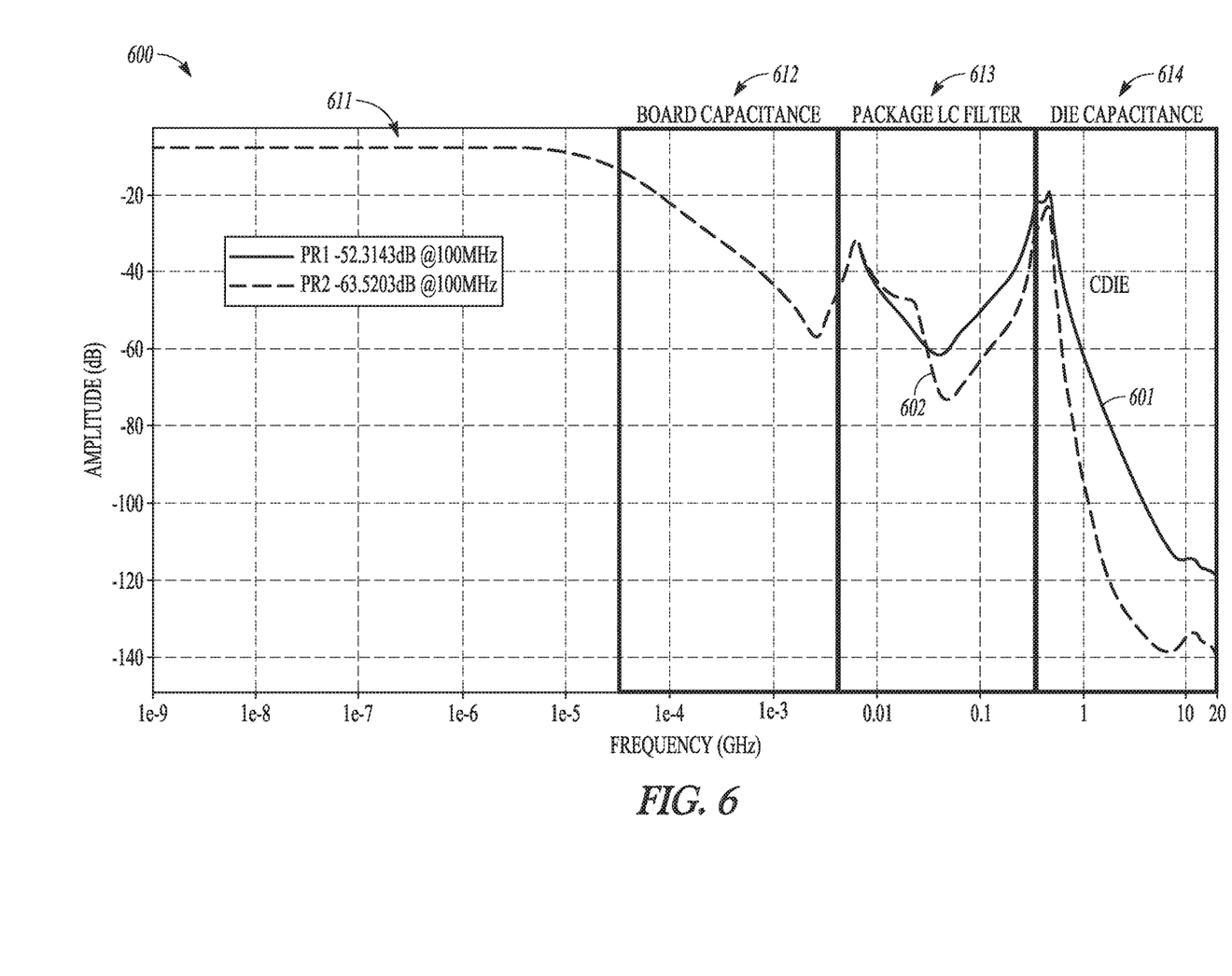
FIG. 6 illustrates generally an example of a chart that shows low-pass filter characteristics including information about signals on a supply rail and a consumer circuit rail.

Power rail merger with low noise coupling can be achieved using a low pass filter, such as a low pass LC filter that includes one or more of an integrated inductor or capacitor. FIG. 6 illustrates generally an example of a chart 600 that includes first and second curves 601 and 602. The first and second curves 601 and 602 correspond to first and second power rails, respectively, and represent respective isolation effectiveness indications over a range of frequencies. The first and second power rails are isolated from each other using an integrated inductor (e.g., an integrated coil inductor or a PTH inductor). In an example, the first power rail is additionally isolated from a source node (e.g., a BGA bump coupled to a Vcc pin) using an integrated inductor.

In the example of FIG. 6, the first and second curves 601 and 602 can generally be described as including four curve regions. A first region 611 corresponds to a low-pass band wherein at low frequencies the LC filter passes all content, and noise signals on the first and second power rails are generally not attenuated. A second region 612 corresponds to a portion of a roll-off band. The location of the second region 612, such as including a 3 dB roll-off frequency, depends in part on capacitance and resistance of the circuit at the board level of the circuit.

A third region 613 corresponds to a portion of a roll-off band that is influenced at least in part by the LC filter that includes the integrated inductor. The third region 613 generally comprises a valley portion, a minimum of which can be precisely tuned by adjusting one or more characteristics of the integrated inductor, the capacitance, and a resistance associated with the filter. A fourth region 614 corresponds to a portion of a roll-off band that is influenced at least in part by a die capacitance.

In the example of FIG. 6, the third region 613 includes a band of interest, such as around 100 MHz. The band of interest can correspond to a switching frequency of one of the first and second power rails. In an example, relative to common reference signal, the first power rail PR1 has a noise attenuation of about −52.3 dB at 100 MHz, and the second power rail PR2 has a noise attenuation of about −63.5 dB at 100 Mhz. In this example, the amplitude of the noise signal at 100 MHz at the second power rail PR2 is less than half that of the noise signal at the first power rail PR1, and the amplitude of the noise signal at 100 MHz at the first power rail PR1 is isolated from the noise source by −52.3 dB. Thus, in this example, the filters including the integrated inductors effectively isolate the power signals from the aggressor circuit or aggressor rail, and the second power rail PR2 is further effectively isolated from both the power signal at the first power rail PR1 and the initial aggressor circuit.

Figure 7:
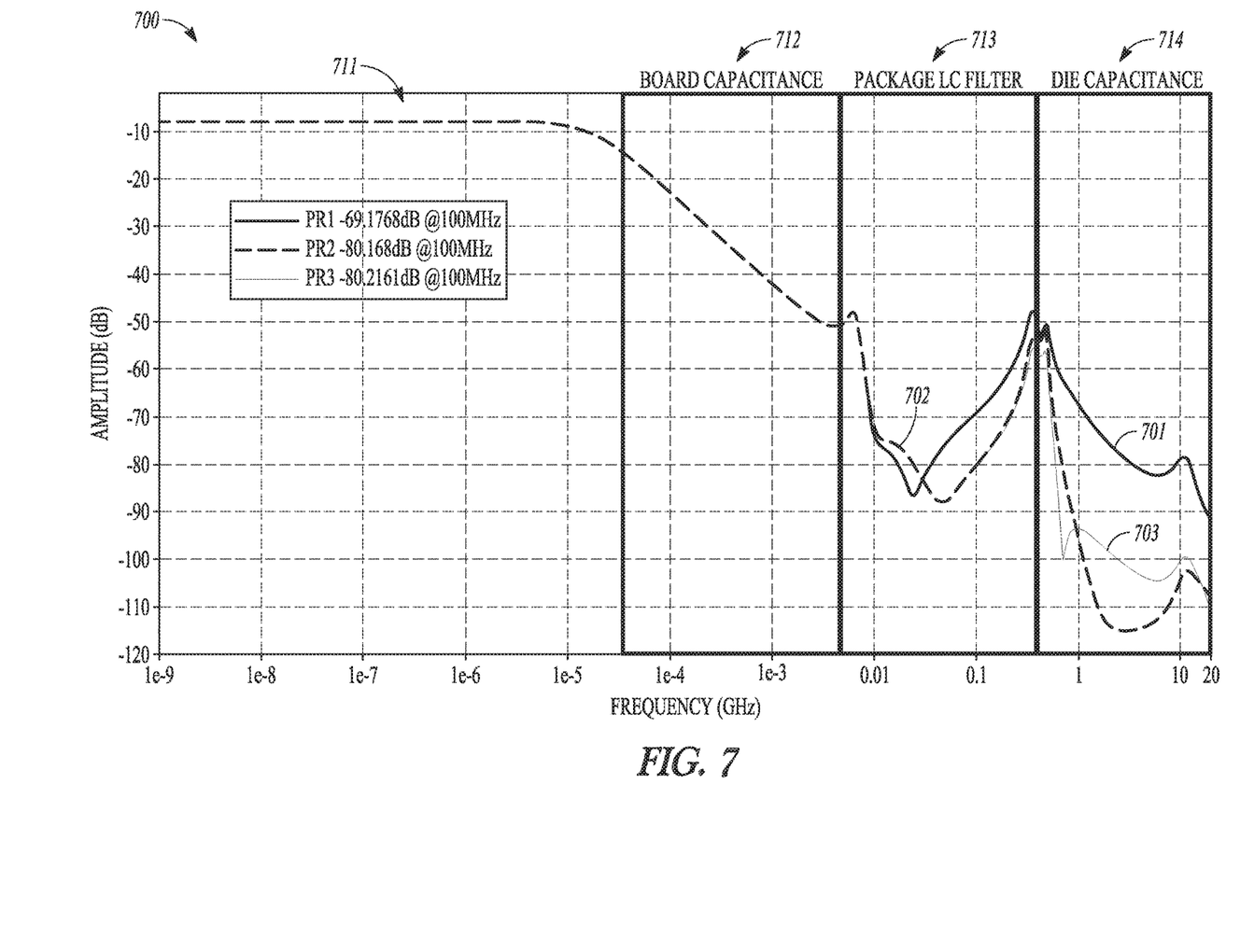
FIG. 7 illustrates generally an example of a chart that shows low-pass filter characteristics including information about signals on different consumer circuit power rails.

FIG. 7 illustrates generally an example of a chart 700 that includes first, second, and third curves 701, 702, and 703. The first, second, and third curves 701, 702, and 703 correspond to first, second, and third power rails, respectively, and represent respective power rail noise levels over a range of frequencies relative to a voltage source node. Each of the power rails is isolated from the others using at least one filter or isolation module comprising an integrated inductor.

In the example of FIG. 7, each of the first, second, and third curves 701, 702, and 703 can generally be described as including four curve regions, such as described above in the example of FIG. 6. A first region 711 corresponds to a low-pass band, a second region 712 corresponds to a portion of a roll-off band influenced by a board level capacitance, a third region 713 corresponds to a portion of a roll-off band influenced at least in part by the LC filter that includes the integrated inductor, and a fourth region 714 corresponds to a portion of a roll-off band that is influenced at least in part by a die capacitance.

In the example of FIG. 7, the third region 713 includes a band of interest, such as around 100 MHz. As shown, the LC filter that includes the integrated inductor provides, at the first power rail, about 69 dB of attenuation at 100 MHz relative to the voltage source or aggressor node. Further attenuation of the aggressor signal is observed at the second and third power rails as the power signal is further isolated using additional LC filters between the rails.

ADDITIONAL NOTES AND EXAMPLES

Example 1 can include an integrated circuit package comprising a first power rail coupled to a power supply node, the first power rail configured to transmit a first power signal from the power supply node to a first consumer circuit, and a second power rail configured to transmit a second power signal, based on the first power signal, to a second consumer circuit. Example 1 can include a first isolation module configured to receive the first power signal from the first power rail and, in response, provide the second power signal at the second power rail. In Example 1, the first isolation module can include a first integrated inductor and a first integrated capacitor. In Example 1, the first integrated inductor can include first and second inductor terminals coupled respectively to the first and second power rails. In Example 1, the first integrated capacitor can include a first capacitor terminal coupled to the first power rail, and a second capacitor terminal coupled to a reference node.

In Example 2, the subject matter of Example 1 can optionally include the first and second consumer circuits operable at different switching frequencies.

In Example 3, the subject matter of any one of Examples 1 or 2 can optionally include a third power rail configured to transmit a third power signal, based on the second power signal, to a third consumer circuit. Example 3 can include a second isolation module configured to receive the second power signal from the second power rail and, in response, provide the third power signal at the third power rail. In Example 3, the second isolation module can include a second integrated inductor and a second integrated capacitor.

In Example 4, the subject matter of any one of Examples 1 through 3 can optionally include the first integrated inductor, and the first integrated inductor can include a first trace in a first layer, a second trace in a second layer, the second layer spaced apart from and substantially parallel to the first layer, and a via that electrically couples the first and second traces.

In Example 5, the subject matter of Example 4 can optionally include the first and second traces are substantially overlapping and each of the first and second traces comprises multiple turns.

In Example 6, the subject matter of any one of Examples 4 or 5 can optionally include the first and second traces are substantially rectangular and spiral shaped, and the first and second traces each comprise at least three turns each.

In Example 7, the subject matter of any one of Examples 4 through 6 can optionally include the first and second traces having substantially circular geometries.

In Example 8, the subject matter of any one of Examples 4 through 7 can optionally include the first integrated inductor has an inductance of about 4 nH.

In Example 9, the subject matter of any one of Examples 4 through 8 can optionally include the first integrated inductor has a substantially centrally-located void volume.

In Example 10, the subject matter of Example 9 can optionally include the first integrated inductor occupies a landing area of about 1 mm square, and a cross-sectional area of the void volume occupies less than about 20% of the 1 mm square landing area.

In Example 11, the subject matter of any one of Examples 1 through 10 can optionally include the first integrated inductor, including multiple spaced apart conductive vias that are coupled in series.

In Example 12, the subject matter of any one of Examples 1 through 11 can optionally include the first integrated inductor, including spaced apart first and second conductive vias corresponding respectively to the first and second terminals of the first integrated inductor. In Example 12, the first via can be electrically coupled to different first and second conductive planar traces. In Example 12, the second via can be electrically coupled to the second conductive planar trace and to a different third conductive planar trace. In Example 12, the second via can be electrically coupled to the first via using the second trace to form at least a portion of an inductor turn. In Example 12, the first, second, and third traces can be substantially parallel.

In Example 13, the subject matter of Example 12 can optionally include the first integrated inductor, including a third via that is electrically coupled to a fourth conductive planar trace that is parallel to the other traces, and the third via is electrically coupled to the second via using the third layer. In Example 13, the third via can be disposed nearer to the first via than is the second via.

In Example 14, the subject matter of any one of Examples 1 through 13 can optionally include the first integrated capacitor, including a land-side capacitor circuit disposed on an interconnect side of a die comprising the integrated circuit package.

In Example 15, the subject matter of any one of Examples 1 through 14 can optionally include at least one of the first and second consumer circuits coupled to the second capacitor terminal at the reference node.

In Example 16, the subject matter of any one of Examples 1 through 15 can optionally include a system comprising a processor circuit, or a power converter circuit. In Example 16, the power converter circuit can be coupled to the processor circuit and can be configured to provide, to the processor circuit, regulated DC power supply signals including first and second voltage signals. In Example 16, the processor circuit can comprise a semiconductor die, the semiconductor die including first and second power domains configured to receive the first and second voltage signals, respectively. In Example 16, each of the first and second power domains can include multiple power rails, configured to provide different power signals to consumer circuits corresponding to the multiple power rails. In Example 16, each of the multiple power rails can be coupled to an adjacent power rail in the same domain or to the power converter circuit using an integrated inductor circuit and an integrated capacitor circuit.

In Example 17, the subject matter of Example 16 can optionally include the integrated inductor circuit, including multiple stacked planar traces that are electrically coupled and that are arranged to provide an inductance. In Example 16, each of the traces can comprise at least one turn of about 90 degrees.

In Example 18, the subject matter of any one of Examples 16 or 17 can optionally include the integrated inductor, including multiple plated through-hole vias that are electrically connected in series to provide an inductance when an electric current is provided to the integrated inductor circuit.

In Example 19, the subject matter of any one of Examples 16 through 18 can optionally include the processor circuit included in an integrated circuit that comprises a flip chip ball grid array package.

In Example 20, the subject matter of any one of Examples 1 through 19 can optionally include a semiconductor package comprising a power supply node and multiple consumer circuits. In Example 20, the multiple consumer circuits can include a first consumer circuit coupled to the power supply node, and the first consumer circuit can have a first noise tolerance characteristic. In Example 20, the multiple consumer circuits can include a second consumer circuit having a different second noise tolerance characteristic. Example 20 can include a first integrated LC filter coupled between the power supply node and the second consumer circuit, and the first integrated LC filter can be configured to transmit a first conditioned power signal from the power supply node to the second consumer circuit. Example 20 can include a third consumer circuit having a different third noise tolerance characteristic, and a second integrated LC filter coupled between the second and third consumer circuits. The second integrated LC filter can be configured to transmit a second conditioned power signal from the second consumer circuit to the third consumer circuit.

In Example 21, the subject matter of Example 20 can optionally include the first and second consumer circuits operable at different switching frequencies.

In Example 22, the subject matter of any one of Examples 20 or 21 can optionally include, in at least one of the first and second integrated LC filters, an integrated inductor comprising a first trace in a first layer, a second trace in a second layer, and the second layer is spaced apart from and substantially parallel to the first layer. In Example 22, a via can electrically couple the first and second traces.

In Example 23, the subject matter of any one of Examples 20 through 22 can optionally include, in at least one of the first and second integrated LC filters, an integrated inductor comprising multiple spaced apart vias that are coupled in series.

The above detailed description includes references to the accompanying drawings, which form a part of the detailed description. The drawings show, by way of illustration, specific embodiments in that may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is to allow the reader to quickly ascertain the nature of the technical disclosure and is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the embodiments should be determined with reference to the appended claims, along with the full scope of equivalents to which such claims are entitled.

What is claimed is:

1. A system comprising:
   a processor circuit;
   a power converter circuit coupled to the processor circuit and configured to provide, to the processor circuit, regulated DC power supply signals including first and second voltage signals;
   wherein the processor circuit comprises a semiconductor die, the semiconductor die including first and second power domains configured to receive the first and second voltage signals, respectively, and wherein the processor circuit further comprises a first integrated inductor circuit and a first integrated capacitor circuit;
   wherein each of the first and second power domains includes at least one power rail, and wherein each of the power rails is configured to provide different power signals to respective consumer circuits, and
   wherein a first power rail in the first power domain is coupled to a second power rail using the first integrated inductor circuit and the first integrated capacitor circuit.

2. The system of claim 1, wherein the first power domain comprises the first and second power rails.

3. The system of claim 1, wherein the first integrated inductor circuit comprises multiple stacked planar traces that are electrically coupled in series and that are configured to provide an inductance.

4. The system of claim 3, wherein multiple ones of the stacked planar traces comprise at least one trace that turns about 90 degrees.

5. The system of claim 1, wherein the first integrated inductor circuit comprises multiple through-hole vias that are electrically connected in series to provide an inductance when an electric current is provided to the first integrated inductor circuit.

6. The system of claim 1, wherein the first integrated inductor circuit includes first and second inductor terminals coupled respectively to the first and second power rails.

7. The system of claim 6, wherein the first integrated capacitor circuit includes first and second capacitor terminals coupled respectively to the first inductor terminal and a reference ground node.

8. The system of claim 1, wherein the first and second power rails are coupled to respective first and second consumer circuits, and wherein the first and second consumer circuits operate at different switching frequencies.

9. The system of claim 1, wherein the first integrated inductor circuit comprises:

a first trace in a first layer and a second trace in a second layer, the second layer spaced apart from and substantially parallel to the first layer; and a via that electrically couples the first and second traces;

wherein the first and second traces are substantially overlapping and each of the first and second traces comprises multiple turns.

10. The system of claim 1, wherein the first integrated inductor circuit provides an inductance of about 4 nH.

11. The system of claim 1, wherein the first integrated inductor circuit has a substantially centrally-located void volume, and wherein the first integrated inductor circuit occupies a landing area of about 1 mm square, and wherein a cross-sectional area of the void volume occupies less than about 20% of the 1 mm square landing area.

12. The system of claim 1, wherein the first integrated capacitor circuit includes a land-side capacitor circuit disposed on an interconnect side of the semiconductor die.

13. A system comprising:

a processor circuit;

a power converter circuit coupled to the processor circuit and configured to provide, to the processor circuit, regulated DC power supply signals including first and second voltage signals;

wherein the processor circuit comprises a semiconductor die, the semiconductor die including first and second power domains configured to receive the first and second voltage signals, respectively;

wherein each of the first and second power domains includes multiple power rails, configured to provide different power signals to consumer circuits corresponding to the multiple power rails, and wherein each of the multiple power rails is coupled to an adjacent power rail in the same domain or to the power converter circuit using an integrated inductor circuit and an integrated capacitor circuit.

14. The system of claim 13, wherein the integrated inductor circuit comprises multiple stacked planar traces that are electrically coupled and that are arranged to provide an inductance; and wherein each of the traces comprises at least one turn of about 90 degrees.

15. The system of claim 13, wherein the integrated inductor circuit comprises multiple plated through-hole vias that are electrically connected in series to provide an inductance when an electric current is provided to the integrated inductor circuit.

16. A processor circuit comprising:

first and second power domains configured to receive respective power signals from a power converter circuit, wherein the first power domain includes at least first and second power rails configured to provide power signals to respective consumer circuits;

a first integrated inductor circuit coupled between the first and second power rails in the first power domain; and a first integrated capacitor circuit coupled between the first power rail and a reference ground node.

17. The processor circuit of claim 16, wherein the first integrated inductor circuit comprises respective traces on multiple stacked circuit layers that are electrically coupled in series to provide an inductance, wherein the multiple stacked traces form a substantially spiral-shaped electrical signal path.

18. The processor circuit of claim 16, wherein the respective consumer circuits operate at different switching frequencies.

19. The processor circuit of claim 16, wherein the first integrated inductor circuit comprises:

a first trace in a first layer and a second trace in a second layer, the second layer spaced apart from and substantially parallel to the first layer; and a via that electrically couples the first and second traces;

wherein the first and second traces are substantially overlapping and each of the first and second traces comprises multiple turns.

20. The processor circuit of claim 16, wherein the first integrated capacitor circuit includes a land-side capacitor disposed on an interconnect side of a semiconductor die that comprises the processor circuit.

* * * * *